United States Patent
Kumata

(10) Patent No.: US 7,683,691 B2
(45) Date of Patent: Mar. 23, 2010

(54) CLOCK SUPPLYING APPARATUS

(75) Inventor: Ichiro Kumata, Kanagawa (JP)

(73) Assignee: Sony Corporation, Tokyo (JP)

( * ) Notice: Subject to any disclaimer, the term of this patent is extended or adjusted under 35 U.S.C. 154(b) by 39 days.

(21) Appl. No.: 12/000,481

(22) Filed: Dec. 13, 2007

(65) Prior Publication Data

US 2008/0150606 A1    Jun. 26, 2008

(30) Foreign Application Priority Data

Dec. 20, 2006    (JP) .............................. 2006-343409

(51) Int. Cl.
*H03K 3/00*    (2006.01)
(52) U.S. Cl. .......................... 327/292; 327/299; 326/30
(58) Field of Classification Search ................. 327/292, 327/295, 297, 299, 52, 55, 57; 333/1, 5, 333/12, 17.3; 326/21, 30
See application file for complete search history.

(56) References Cited

U.S. PATENT DOCUMENTS 5,929,716 A  *  7/1999  Komori et al.  .............. 331/135

FOREIGN PATENT DOCUMENTS

| JP | 01-256837 | 10/1989 |
|---|---|---|
| JP | 03-004633 | 1/1991 |
| JP | 03-266543 | 11/1991 |
| JP | 04-271575 | 9/1992 |
| JP | 11-284439 | 10/1999 |

* cited by examiner

*Primary Examiner*—An T Luu
(74) *Attorney, Agent, or Firm*—Rader, Fishman & Grauer LLP

(57) ABSTRACT

Disclosed herein is a clock supplying apparatus for supplying a clock to a digital circuit, including: a differential clock driver; a first clock line along which a first clock of a positive phase from the clock driver propagates; a second clock line along which a second clock of a reverse phase from the clock driver propagates; and a parallel resonance circuit of an inductor and a capacitor. The inductor of the parallel resonance circuit is connected at a first end to the first clock line and at a second end to the second clock line. The capacitor of the parallel resonance circuit is connected at a first electrode to the first clock line and at a second electrode to the second clock line.

2 Claims, 13 Drawing Sheets

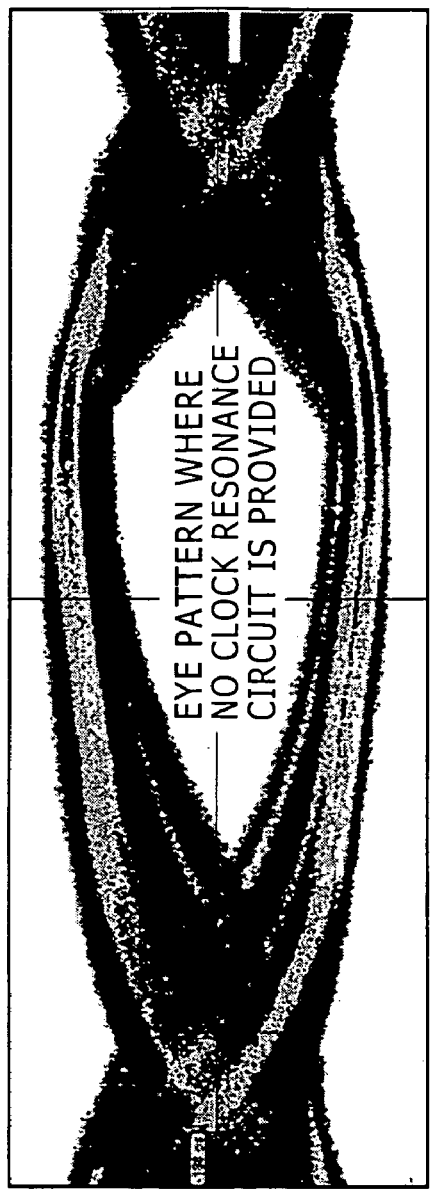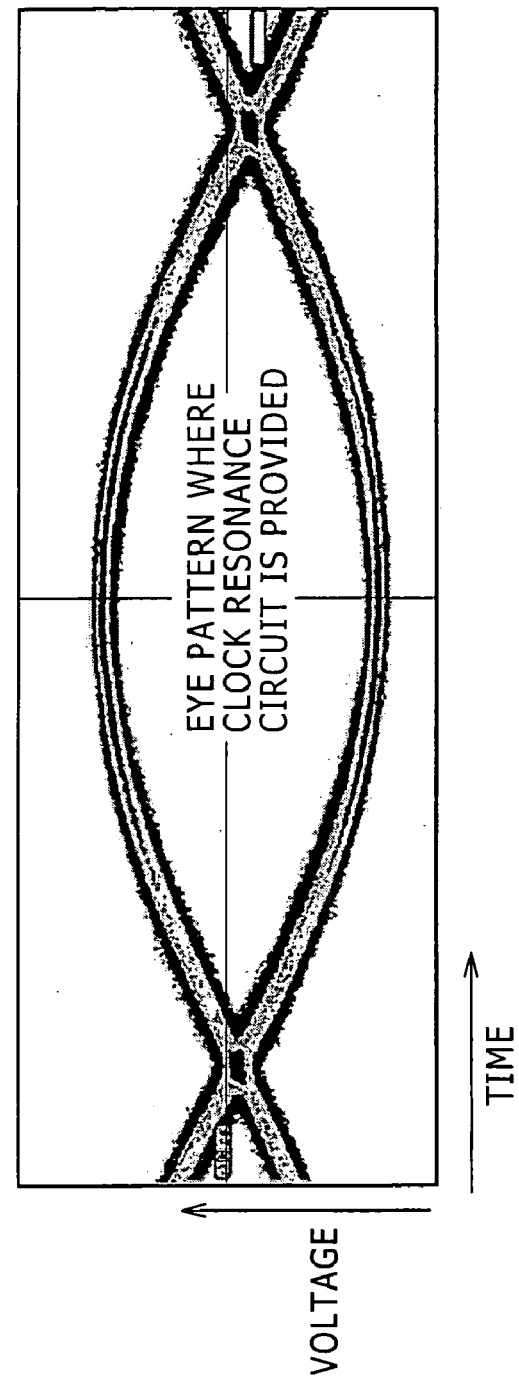
FIG. 3A
FIG. 3B

CLOCK SUPPLYING APPARATUS

CROSS REFERENCES TO RELATED APPLICATIONS

The present invention contains subject matter related to Japanese Patent Application JP 2006-343409 filed with the Japan Patent Office on Dec. 20, 2006, the entire contents of which are incorporated herein by reference.

BACKGROUND OF THE INVENTION

1. Field of the Invention

This invention relates to a clock supplying apparatus for supplying a clock to a digital circuit.

2. Description of the Related Art

A digital circuit which uses a high speed clock signal is influenced much by jitters of the clock, and this influence is a cause in a drop in the operation speed or a malfunction. Therefore, the countermeasures as described below have been taken heretofore.

For a clock generation circuit, power supply lines are isolated from power supply lines for the other circuits in order to reduce jitters by power supply noise. Also, such countermeasures as the additional provision of a bypass controller, the insertion of a power supply filter or the use of a power supply regulator circuit for exclusive use have been taken in the past.

As a countermeasure against crosstalk noise on a clock transmission line, also, such countermeasures as laying the clock transmission line in a spaced relationship away from other signal lines or shielding the clock transmission line on the opposite sides with a ground (GND) signal line are known well.

As a different countermeasure, using an LC resonance circuit in a clock generation circuit as disclosed, for example, in Japanese Patent Laid-Open No. Hei 11-284439 (hereinafter referred to as Patent Document 1), is known.

The LC resonance circuit is provided additionally for a feedback loop for oscillation.

As a further method, using an LC resonance circuit in a reproduction circuit for a clock as disclosed, for example, in Japanese Patent Laid-Open No. Hei 1-256837 (hereinafter referred to as Patent Document 2) or Japanese Patent Laid-Open No. Hei 3-4633 (hereinafter referred to as Patent Document 3), is known.

The effects of an LC resonance circuit are obtained around a resonance frequency. Therefore, in order to make a plurality of clock frequencies available, one of a plurality of LC resonance circuits is used selectively or a variable inductor or a variable capacitor is used. A circuit of the type just described is disclosed, for example, in Japanese Patent Laid-Open No. Hei 3-266543 (hereinafter referred to as Patent Document 4) or Japanese Patent Laid-Open No. Hei 4-271575 (hereinafter referred to as Patent Document 5).

SUMMARY OF THE INVENTION

However, the countermeasures against power supply noise for a clock generation circuit described hereinabove are disadvantageous in that they increase the number of man-hours for design and the cost.

Meanwhile, the method of laying a clock transmission line in a spaced relationship from other signal lines or shielding a clock transmission line on the opposite sides with a GND signal line as a countermeasure against crosstalk noise on the clock transmission line is disadvantageous in that a mounting area is increased.

The apparatus disclosed in Patent Document 1 additionally includes an LC resonance circuit provided in a feedback loop for oscillation. However, since the feedback loop is susceptible to noise, it is necessary to dispose the LC resonance circuit in the proximity of the oscillation circuit.

Accordingly, with the apparatus disclosed in Patent Document 1, where a circuit which utilizes the clock generated is located remotely, the clock generation circuit may not be placed adjacent to the circuit which utilizes the clock. Therefore, it is difficult to reduce crosstalk noise which is generated in a clock transmission line between the clock generation circuit and the circuit which utilizes the clock.

Meanwhile, with the circuit disclosed in Patent Document 2 or 3, where an LC resonance circuit is connected at one side thereof to the ground (GND) and at the other side thereof to a clock signal line, the LC resonance circuit in a resonance mode generates positive and negative voltages across the ground (GND).

Therefore, it is necessary to prepare two power supply systems and use a driver or a receiver which uses two positive and negative power supplies or to use a complicated circuit for performing DC cutting or applying a DC bias.

Further, with the circuit disclosed in Patent Document 4 or 5, in order to make it possible to be ready for a plurality of clock frequencies, it is necessary to select one of a plurality of LC resonance circuits or use a variable inductor or capacitor.

Therefore, a complicated control mechanism or a control signal from the outside may be required.

Accordingly, it is demanded to provide a clock supplying apparatus which can exhibit a significant jitter reduction effect with a simple configuration and which can supply a stabilized clock.

According to an embodiment of the present invention, there is provided a clock supplying apparatus for supplying a clock to a digital circuit, including a differential clock driver, a first clock line along which a first clock of a positive phase from the clock driver propagates, a second clock line along which a second clock of a reverse phase from the clock driver propagates, and a parallel resonance circuit of an inductor and a capacitor, the inductor of the parallel resonance circuit being connected at a first end thereof to the first clock line and at a second end thereof to the second clock line, and the capacitor of the parallel resonance circuit being connected at a first electrode thereof to the first clock line and at a second electrode thereof to the second clock line.

According to another embodiment of the present invention, there is provided a clock supplying apparatus for supplying a clock to a digital circuit, including a differential clock driver, a clock line along which a clock from the clock driver propagates, a parallel resonance circuit of an inductor and a capacitor, and a bias circuit configured to generate a voltage proximate to an average value of a clock signal voltage, the inductor and the capacitor being connected at a first end and a first electrode thereof, respectively, to the clock line while being connected at a second end and a second electrode thereof, respectively, commonly to a voltage supply line of the bias circuit.

According to a further embodiment of the present invention, there is provided a clock supplying apparatus for supplying a clock to a digital circuit, including a plurality of clock supplying units, each of the clock supplying units having a differential clock driver configured to receive an original clock inputted thereto and generate a first a clock of a positive phase and a second clock of a reverse phase from the original clock, a first clock line along which a first clock of a positive phase from the clock driver propagates, a second clock line along which a second clock of a reverse phase from the clock driver propagates, a parallel resonance circuit of an inductor and a capacitor, a first passive element connected to the first clock line, and a second passive element connected to the second clock line, the inductor of the parallel resonance circuit being connected at a first end thereof to the first clock line and at a second end thereof to the second clock line, the capacitor of the parallel resonance circuit being connected at a first terminal thereof to the first clock line and at a second terminal thereof to the second clock line, and the first passive elements of the clock supplying units being connected to each other while the second passive elements of the clock supplying units are connected to each other.

According to a still further embodiment of the present invention, there is provided a clock supplying apparatus for supplying a clock to a digital circuit, including a plurality of clock supplying units, each of the clock supplying units having a clock driver configured to drive an original clock, a clock line along which a clock from the clock driver propagates, a parallel resonance circuit of an inductor and a capacitor, a passive element connected to the clock line, and a bias circuit configured to generate a voltage proximate to an average value of a clock signal voltage, the inductor and the capacitor being connected at a first end and a first electrode thereof, respectively, to the clock line while being connected at a second end and a second electrode thereof, respectively, commonly to a voltage supply line of the bias circuit. the passive elements of the clock supplying units being connected to each other.

In the clock supplying apparatus, a resonance current flows in a closed loop formed from the inductor and the capacitor in the resonance circuit.

A magnetic field generated from the inductor and a charge retained into the capacitor by the current are energy that is converted alternately in the resonance frequency. If jitters are detected, then the accumulated resonance energy is discharged from the parallel resonance circuit so as to compensate for the jitters.

This is analogous to the fact that a pendulum of a clock oscillates while carrying out an alternate conversion between position energy and kinetic energy such that, even if it is acted upon by a disturbance, it keeps the oscillating movement of a fixed period.

A jitter reduction effect can be obtained by the mechanism just described.

With the clock supplying apparatus, a high jitter reduction effect can be implemented by a simple configuration, and a stabilized clock can be supplied.

The above and other objects, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIG. 3A is a view illustrating a clock of a stabilized clock supplying apparatus which does not include a parallel resonance circuit, and FIG. 3B is a view illustrating a clock of another stabilized clock supplying apparatus which includes a parallel resonance circuit;

DETAILED DESCRIPTION OF THE PREFERRED EMBODIMENTS

First Embodiment

Figure 1:
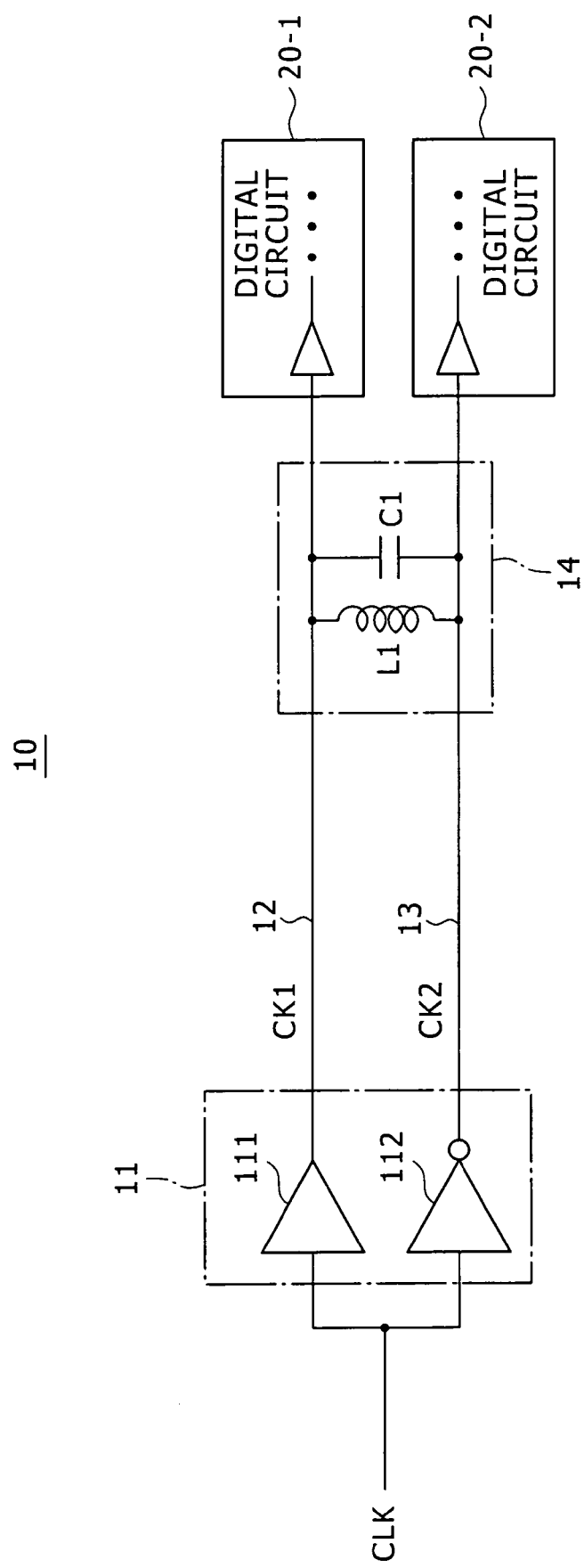
FIG. 1 is a circuit diagram showing an example of a configuration of a stabilized clock supplying apparatus to which the present first embodiment is applied.

FIG. 1 shows an example of a configuration of a stabilized clock supplying apparatus to which the present invention is applied.

Referring to FIG. 1, the stabilized clock supplying apparatus 10 shown includes, as principal components thereof, a differential clock driver section 11, a first clock line 12, a second clock line 13, a parallel resonance circuit 14 of an inductor L1 and a capacitor C1, and a pair of digital circuits 20-1 and 20-2.

The differential clock driver section 11 includes a first clock driver 111 and a second clock driver 112. The first clock driver 111 performs waveform shaping or the like for an original clock CLK of a predetermined frequency inputted thereto to generate a first clock CK1 of a positive phase and supplies the first clock CK1 through the first clock line 12. The second clock driver 112 performs waveform shaping or the like for the original clock CLK of the predetermined frequency inputted thereto to generate a second clock CK2 of a reverse phase and supplies the second clock CK2 through the second clock line 13.

The first clock line 12 is connected at a first end thereof to the output of the first clock driver 111 and at a second end thereof to a clock input terminal of the digital circuit 20-1.

The first clock line 12 transmits the first clock CK1 of the positive phase from the first clock driver 111 therethrough.

The second clock line 13 is connected at a first end thereof to the output of the second clock driver 112 and at a second end thereof to a clock input terminal of the digital circuit 20-2.

The second clock line 13 transmits the second clock CK2 of the reverse phase from the second clock driver 112 therethrough.

The parallel resonance circuit 14 includes an inductor L1 and a capacitor C1 connected in parallel to each other.

The inductor L1 is connected at a first end thereof to the first clock line 12 and at a second end thereof to the second clock line 13.

The capacitor C1 is connected at a first electrode thereof to the first clock line 12 and at a second electrode thereof to the second clock line 13.

The LC parallel resonance circuit 14 is selected so that the resonance frequency thereof which depends upon the inductance of the inductor L1 and the capacitance of the capacitor C1 substantially coincides with the frequency of the original clock CLK inputted to the stabilized clock supplying apparatus 10.

The operation of the clock supplying apparatus 10 having such a configuration as described above is described.

As described hereinabove, the resonance frequency of the LC parallel resonance circuit 14 is selected so as to substantially coincide with the frequency of the original clock CLK inputted to the stabilized clock supplying apparatus 10.

When the original clock CLK is supplied in this condition, the LC parallel resonance circuit 14 is driven by the first and second clock drivers 111 and 112.

In the LC parallel resonance circuit 14, resonance current flows along a closed loop formed from the inductor L1 and the capacitor C1.

A magnetic field generated from the inductor L1 and charge retained into the capacitor C1 by the current are energy that is converted alternately in the resonance frequency. If jitters exist in the clocks CK1 and CK2 propagated in the first clock line 12 or the second clock line 13, then the accumulated resonance energy is discharged from the LC parallel resonance circuit 14 so as to compensate for the jitters.

This is analogous to the fact that a pendulum of a clock oscillates while carrying out an alternate conversion between position energy and kinetic energy such that, even if it is acted upon by a disturbance, it keeps the oscillating movement of a fixed period.

A jitter reduction effect can be obtained by the mechanism just described.

As described above, the stabilized clock supplying apparatus 10 according to the first embodiment of the present invention includes a differential clock driver section 11, a first clock line 12 along which a first clock CK1 of a positive phase from a first clock driver 111 propagates, a second clock line 13 along which a second clock CK2 from another second clock driver 112 propagates, and a parallel resonance circuit 14 of an inductor L1 and a capacitor C1. In the parallel resonance circuit 14, the inductor L1 is connected at a first end thereof to the first clock line 12 and at a second end thereof to the first clock line 12, and the capacitor C1 is connected at a first electrode thereof to the first clock line 12 and at a second electrode thereof to the second clock line 13. Consequently, clock jitters can be reduced significantly by the simple circuit configuration.

Further, if the LC parallel resonance circuit 14 is disposed on the terminal end side (digital circuit side) of a clock line (transmission line), then not only the jitters of a clock generation circuit but also the jitters arising from crosstalk and so forth that are generated in the clock transmission line can be reduced.

This arises from the fact that the LC parallel resonance circuit plays a role of an electric pendulum.

Accordingly, with the stabilized clock supplying apparatus of the present embodiment, the man-hours for the design and the cost can be suppressed when compared with countermeasures according to existing techniques.

Further, if the present countermeasure is used in addition to the countermeasures of existing techniques, then a further reduction of jitters can be achieved advantageously.

Second Embodiment

Figure 2:
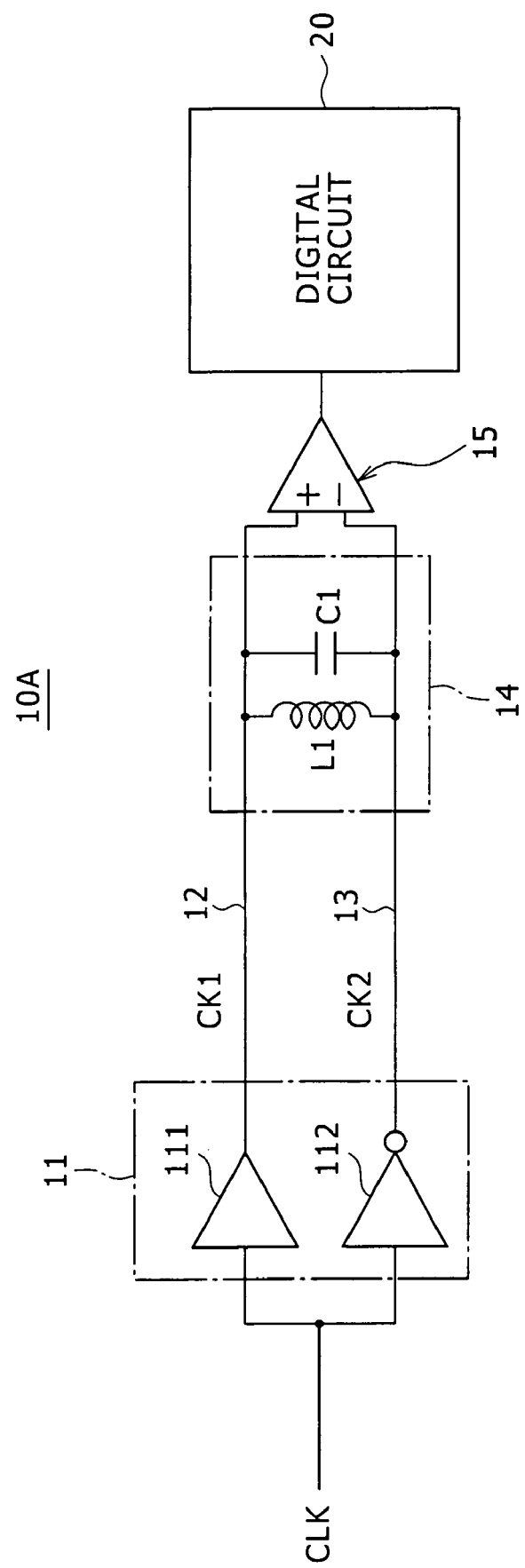
FIG. 2 is a view similar to FIG. 1 but showing an example of a configuration of another stabilized clock supplying apparatus to which the present second embodiment is applied.

FIG. 2 shows an example of a configuration of another stabilized clock supplying apparatus to which the present invention is applied.

Referring to FIG. 2, the clock supplying apparatus 10A according to the second embodiment of the present invention is a modification to, but is different from, the clock supplying apparatus 10 according to the first embodiment described above in that a differential input comparator 15 serving as an amplitude adjustment section is interposed between the second end side of the first clock line 12 and the second clock line 13 and the clock input terminal of a digital circuit 20.

The first clock line 12 is connected at the second end side thereof to a non-inverting input (+) of the differential inputs of the differential input comparator 15 while the second clock line 13 is connected at the second end side thereof to an inverting input (−) of the differential input comparator 15. A clock after an amplitude adjustment from the differential input comparator 15 is outputted to the digital circuit 20.

The reason why such a configuration as just described is adopted is described below.

Even if the resonance frequencies are the same, since the combination of L and C can be selected under the condition of L×C=constant and the resonance impedance differs among different combinations, the output signal amplitude may possibly become short depending upon the selection of L and C, the driving impedance of the differential clock driver section 11, the characteristic impedance of the clock lines 12 and 13 and the load situation of the succeeding stage.

Therefore, in the present second embodiment, the differential input comparator 15 is interposed in the proximity (succeeding stage) of the input to the digital circuit 20 as a countermeasure against such possible shortage of the output signal amplitude.

It is to be noted that, while a differential input comparator is used in the arrangement of FIG. 2, it may be replaced by a buffer which can eliminate such shortage of the output amplitude.

With the clock supplying apparatus 10A of the second embodiment, such advantages as can be achieved by the stabilized clock supplying apparatus 10 of the first embodiment can be achieved. Besides, a shortage of the output signal amplitude can be compensated for.

FIGS. 3A and 3B illustrate clocks from a stabilized clock supplying apparatus. In particular, FIG. 3A illustrates a clock of a clock supplying apparatus which does not include a parallel resonance circuit, and FIG. 3B illustrates a clock of the clock supplying apparatus according to the second embodiment which includes a parallel resonance circuit.

As can be seen from FIGS. 3A and 3B, with the clock supplying apparatus 10A according to the second embodiment of the present invention, clock jitters can be reduced significantly.

Figure 4:
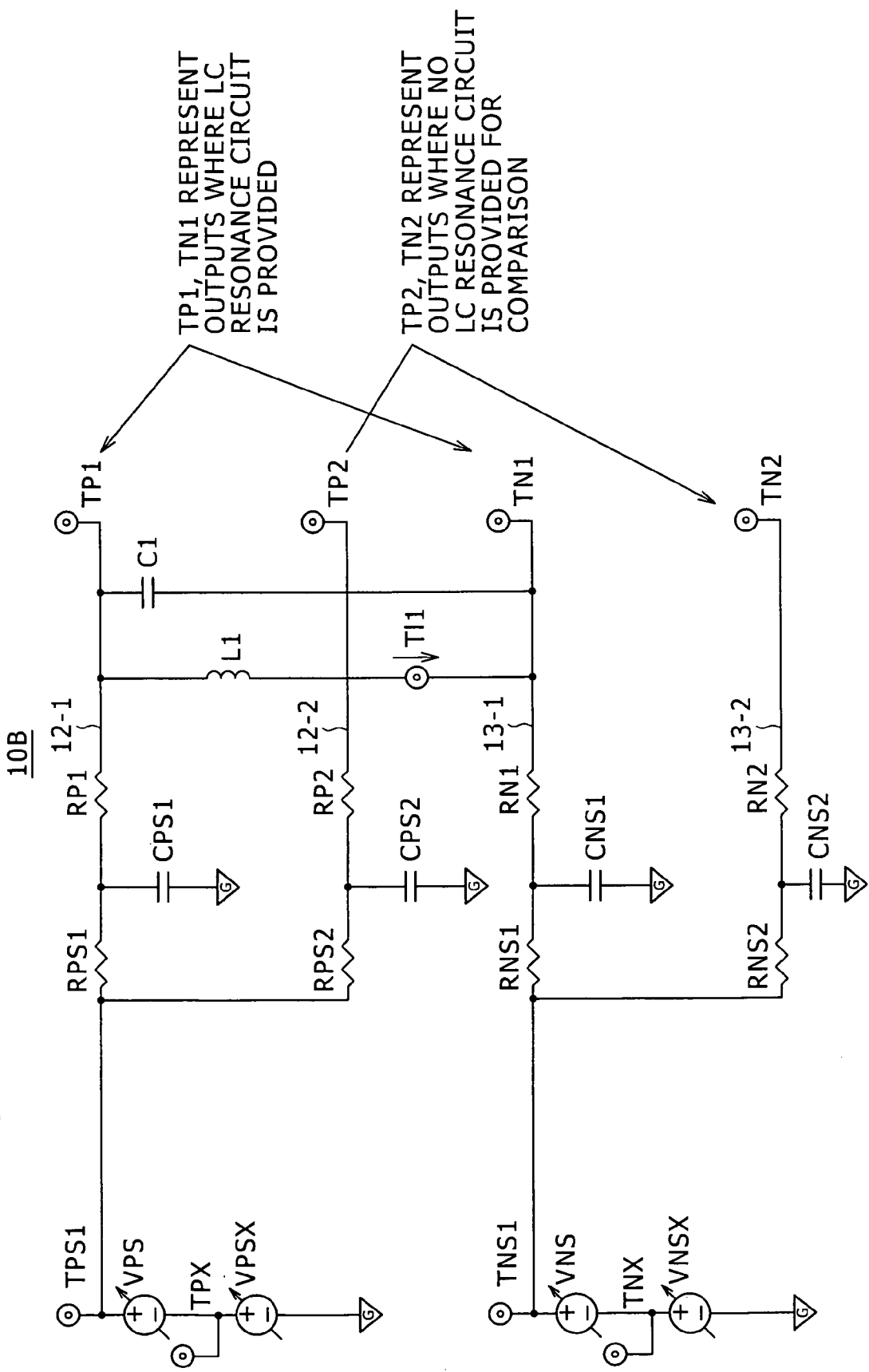
FIG. 4 is a circuit diagram showing a Spice simulation circuit for the clock supplying apparatus of FIG. 2.

Such a Spice simulation circuit 10B for the clock supplying apparatus of FIG. 2, as seen in FIG. 4, was used to perform a simulation.

In the Spice simulation circuit 10B of FIG. 4, reference characters TPS1 and TNS1 denote input terminals of a differential clock; TP1 and TN1 denote output terminals of the LC parallel resonance circuit 14; and TP2 and TN2 denote output terminals where no LC resonance circuit is involved for comparison. Further, reference character T11 denotes a terminal on the second end side of the inductor L1.

Further, reference characters RPS1 and RP1 denote resistance elements interposed in a first clock line 12-1; RPS2 and BP2 denote resistance elements interposed in another first clock line 12-2; NS1 and RN1 denote resistance elements interposed in a second clock line 13-1; and RNS2 and RN2 denote resistance elements interposed in another second clock line 13-2.

Furthermore, reference character CPS1 denotes a capacitor connected between the first clock line 12-1 and a reference potential such as, for example, the ground potential GND; CPS2 denotes a capacitor connected between the first clock line 12-2 and the reference potential such as, for example, the ground potential GND; CNS1 denotes a capacitor connected between the second clock line 13-1 and the reference potential such as, for example, the ground potential GND; and CNS2 denotes a capacitor connected between the second clock line 13-2 and the reference potential such as, for example, the ground potential GND.

Figure 5:
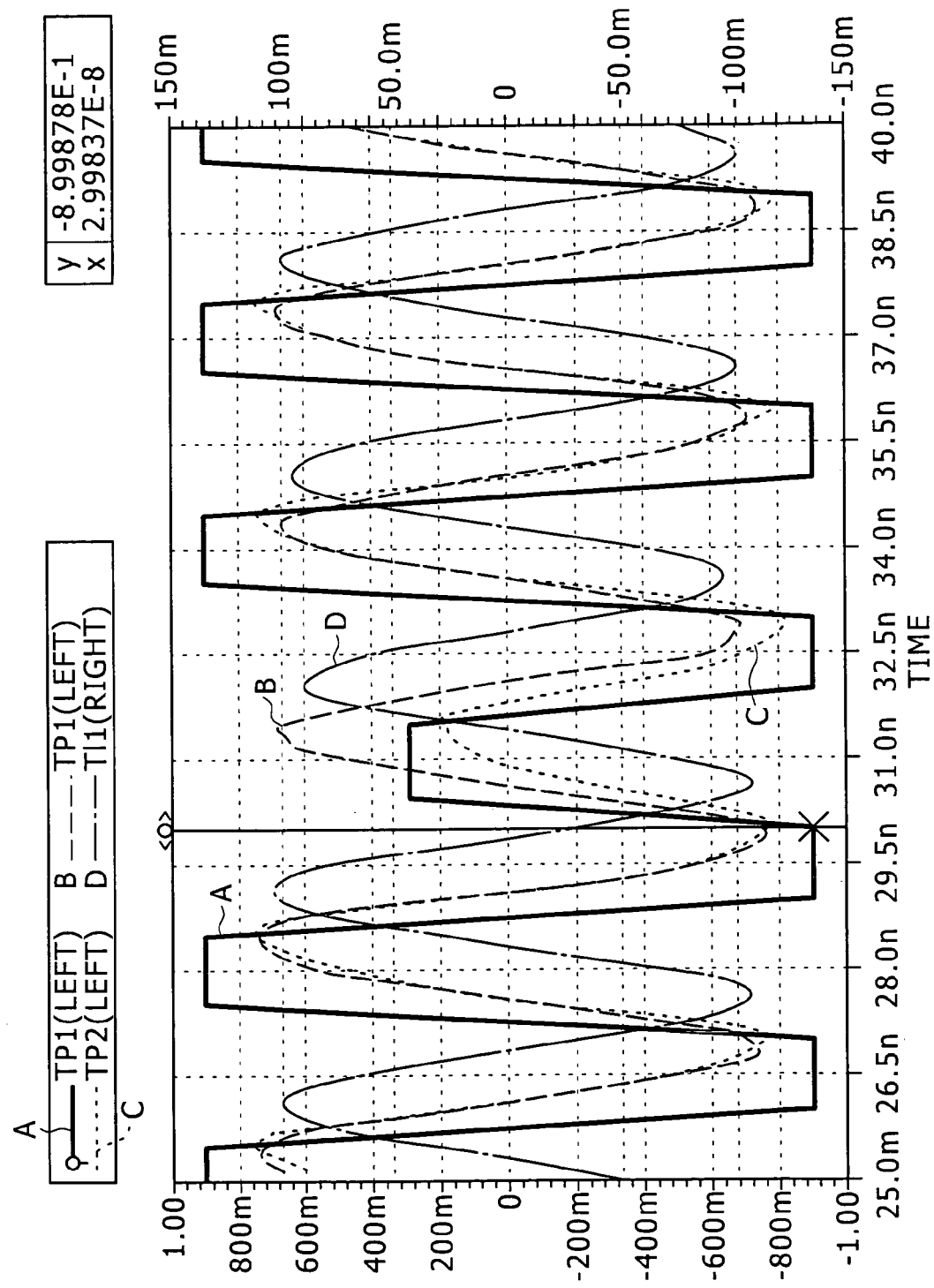
FIG. 5 is a waveform diagram illustrating a result of the Spice simulation carried out using the circuit of FIG. 4.

FIG. 5 illustrates a result of the Spice simulation carried out using the circuit of FIG. 4.

Referring to FIG. 5, the axis of abscissa indicates the time, and the axis of ordinate indicates the relative level. Further, a waveform indicated by reference character A is a waveform at the input terminal TPS1; a waveform indicated by reference character B is a waveform at the output terminal TP1; a waveform indicated by reference character C is a waveform at the output terminal TP2; and a waveform indicated by reference character D is a waveform at the terminal T11.

As can be seen from FIG. 5, even if the original clock CLK has a square waveform or a rectangular waveform, the output of the LC resonance circuit and the output of the device which does not have a resonance circuit exhibit a waveform proximate to a sine waveform.

Further, as seen from the waveforms, even where the input signal is influenced by jitters and so forth, the output waveform B of the LC parallel resonance circuit is outputted from the output terminal TP1 with the influence compensated for.

In contrast, the influence appears as it is with the output waveform where no resonance circuit is provided, and is not compensated for.

In particular, as can be seen from FIG. 5, with the clock supplying apparatus 10A of the present second embodiment, clock jitters can be reduced significantly with the simple circuit configuration.

Third Embodiment

Figure 6:
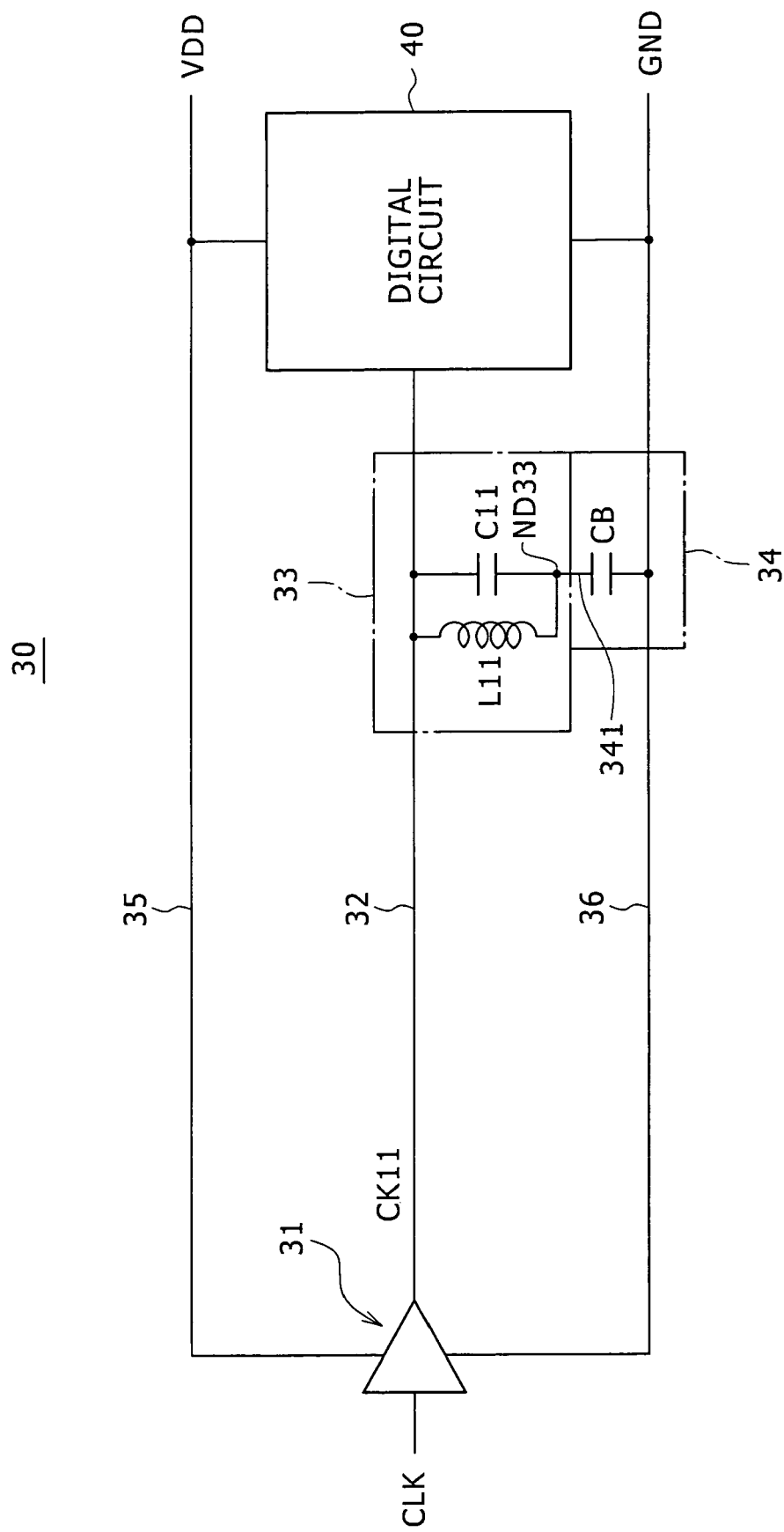
FIG. 6 is circuit diagram showing an example of a configuration of a further stabilized clock supplying apparatus to which the present third embodiment is applied.

FIG. 6 shows an example of a configuration of a further stabilized clock supplying apparatus to which the present third embodiment is applied.

Referring to FIG. 6, the stabilized clock supplying apparatus 30 of the third embodiment includes, as basic components thereof, a clock driver 31, a clock line 32 along which a clock from the clock driver 31 propagates, and a parallel resonance circuit 33 of an inductor L11 and a capacitor C11. The stabilized clock supplying apparatus 30 further includes a bias circuit 34 for generating a voltage close to an average value of a clock signal voltage, a power supply line 35 to which a power supply voltage VDD is supplied, a reference voltage line 36, which may be a ground potential line, and a digital circuit 40.

In the parallel resonance circuit 33, a first end of the inductor L11 and a first electrode of the capacitor C11 are connected to the clock line 32, and a second end of the inductor L11 and a second electrode of the capacitor C11 are connected commonly at a node ND33. The node ND33 serves as a voltage supply line 341 for a voltage close to an average of a clock signal voltage of the bias circuit 34.

The bias circuit 34 in the present third embodiment includes a second capacitor CB that is connected at a first electrode thereof to the node ND33 between the second end of the inductor L11 and the second electrode of the capacitor C11 and at a second electrode thereof to the reference voltage line 36 of a predetermined potential.

In this manner, the clock supplying apparatus 30 of the present third embodiment is different from the stabilized clock supplying apparatus 10 and 10A of the first and second embodiments described hereinabove in that an LC parallel resonance circuit is connected not to a differential driver or a differential clock line (signal line) but to a single driver or clock line (signal line).

Where an LC parallel resonance circuit is connected not to a differential driver or a differential clock line but to a single driver or clock line as described above, if one side of the LC parallel resonance circuit is connected to the driver and the other side of the LC parallel resonance circuit is connected to a reference potential such as, for example, the ground potential GND, then the LC resonance circuit generates a voltage which varies between the positive side and the negative side with reference to an average value of the ground potential GND. Therefore, there is the possibility that a driver or a receiver which uses a single power supply may not operate well.

Therefore, in the clock supplying apparatus 30 of the present third embodiment, an average value of the driving voltage of the clock driver 31 is applied to the node ND33 of the LC parallel resonance circuit 33 so that the LC parallel resonance circuit 33 may generate a voltage with reference to the average value, thereby achieving a configuration which eliminates such a possible fault as described above.

In the clock supplying apparatus 30, the LC parallel resonance circuit 33 is driven by the clock driver 31.

In the LC parallel resonance circuit 33, resonance current flows along a closed loop formed from the inductor L11 and the capacitor C11.

A magnetic field generated from the inductor L11 and a charge retained into the capacitor C11 by the current are energy that is converted alternately in the resonance frequency. If jitters exist in the clock CK11 propagated in the clock line 32, then the accumulated resonance energy is discharged from the LC parallel resonance circuit 33 so as to compensate for the jitters.

This is analogous to the fact that a pendulum of a clock oscillates while carrying out alternate conversion between position energy and kinetic energy such that, even if it is acted upon by a disturbance, it keeps the oscillating movement of a fixed period.

A jitter reduction effect can be obtained by the mechanism just described.

With the stabilized clock supplying apparatus 30 of the third embodiment described above, clock jitters can be reduced significantly by a single circuit configuration.

Further, if the LC parallel resonance circuit 33 is disposed on the terminal end side (digital circuit side) of a clock line (transmission line), then not only the jitters of a clock generation circuit but also the jitters arising from crosstalk and so forth which are generated in the clock transmission line can be reduced.

This arises from the fact that the LC parallel resonance circuit plays a role of an electric pendulum.

Accordingly, with the stabilized clock supplying apparatus of the present embodiment, the man-hours for designing and the cost can be suppressed when compared with countermeasures according to existing techniques.

Further, if the present countermeasure is used in addition to countermeasures of existing techniques, then a further reduction of jitters can be achieved advantageously.

Fourth Embodiment

Figure 7:
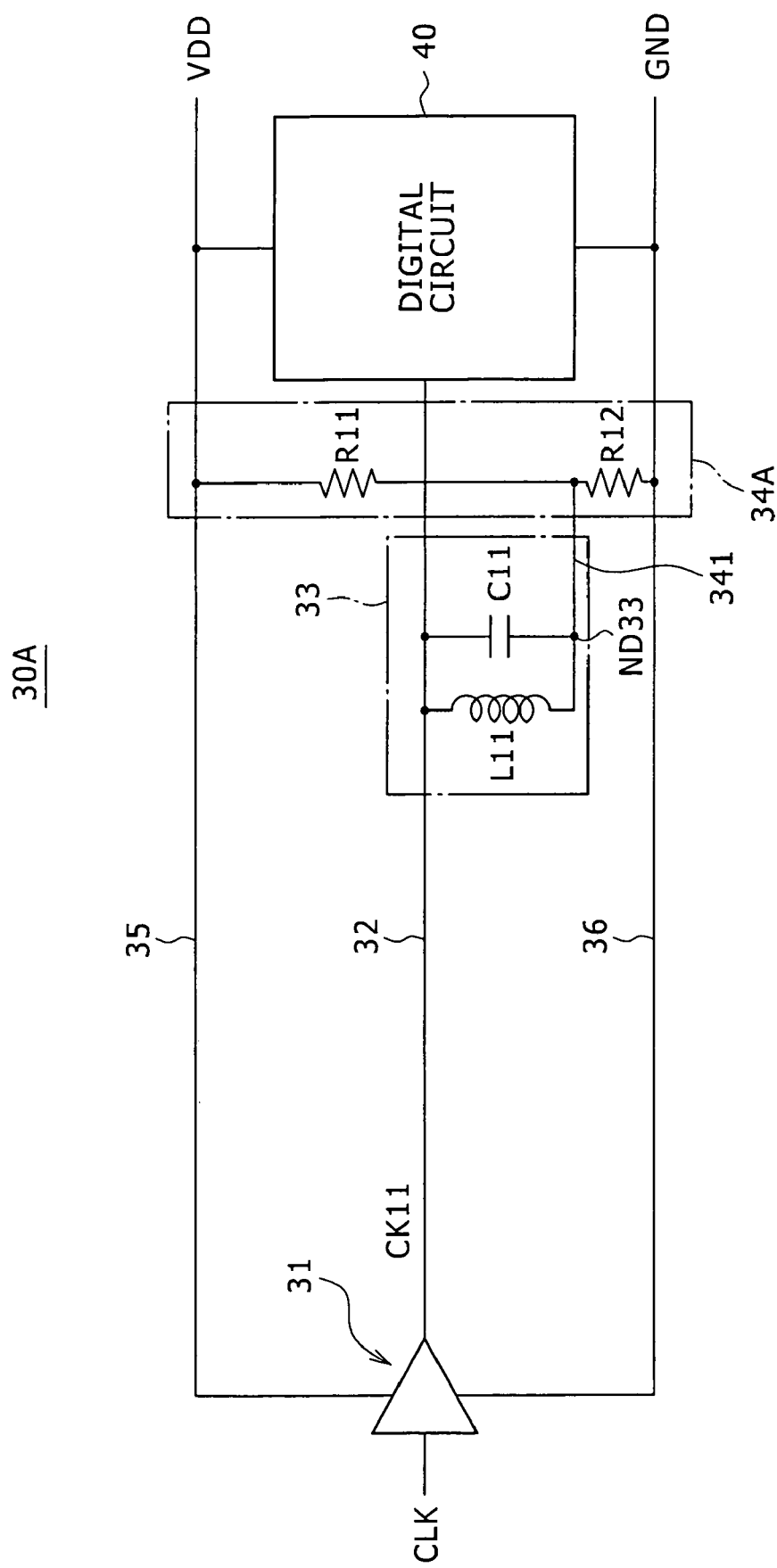
FIG. 7 is circuit diagram showing an example of a configuration of a further stabilized clock supplying apparatus to which the present fourth embodiment is applied.

FIG. 7 shows an example of a configuration of a still further stabilized clock supplying apparatus.

The clock supplying apparatus 30A of the present fourth embodiment is a modification to, and has a configuration similar to, that of the clock supplying apparatus 30 of the third embodiment. However, the clock supplying apparatus 30A is different from the clock supplying apparatus 30 in that a bias circuit 34A thereof includes a voltage dividing circuit of resistance elements R11 and R12 connected in series between the power supply line 35 and the reference voltage line 36 in place of the second capacitor CB connected to the reference voltage line 36. Further, a node between the resistance elements R11 and R12 is connected to the node ND33 of the parallel resonance circuit 33.

With the clock supplying apparatus 30A of the fourth embodiment, advantages similar to those achieved by the stabilized clock supplying apparatus 30 of the third embodiment can be anticipated.

Fifth Embodiment

Figure 8:
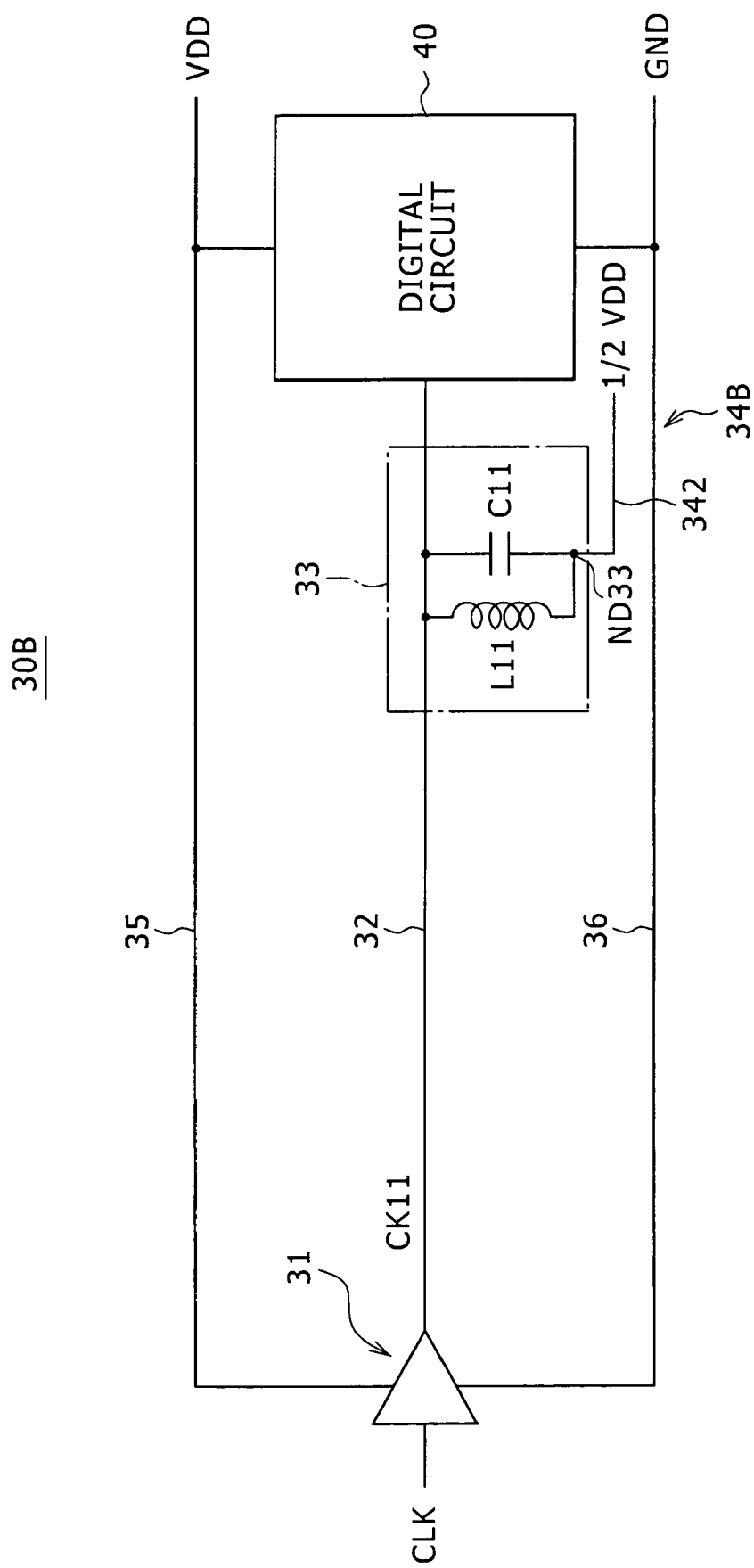
FIG. 8 is circuit diagram showing an example of a configuration of a further stabilized clock supplying apparatus to which the present fifth embodiment is applied.

FIG. 8 shows an example of a configuration of a yet further stabilized clock supplying circuit to which the present invention is applied.

Referring to FIG. 8, the clock supplying apparatus 30B according to the fifth embodiment of the present invention is a modification to, and has a configuration similar to, the clock supplying apparatus 30 of the third embodiment. However, the clock supplying apparatus 30B is different from the clock supplying apparatus 30 in that a bias circuit 34B is formed such that, in place of the second capacitor CB connected to the reference voltage line 36, the node ND33 of the LC parallel resonance circuit 33 is connected to a supply line 342 for an ½ power supply voltage (½ VDD) generated, for example, from a different power supply.

With the clock supplying apparatus 30B of the fifth embodiment, advantages similar to those achieved by the stabilized clock supplying apparatus 30 of the third embodiment can be anticipated.

Sixth Embodiment

Figure 9:
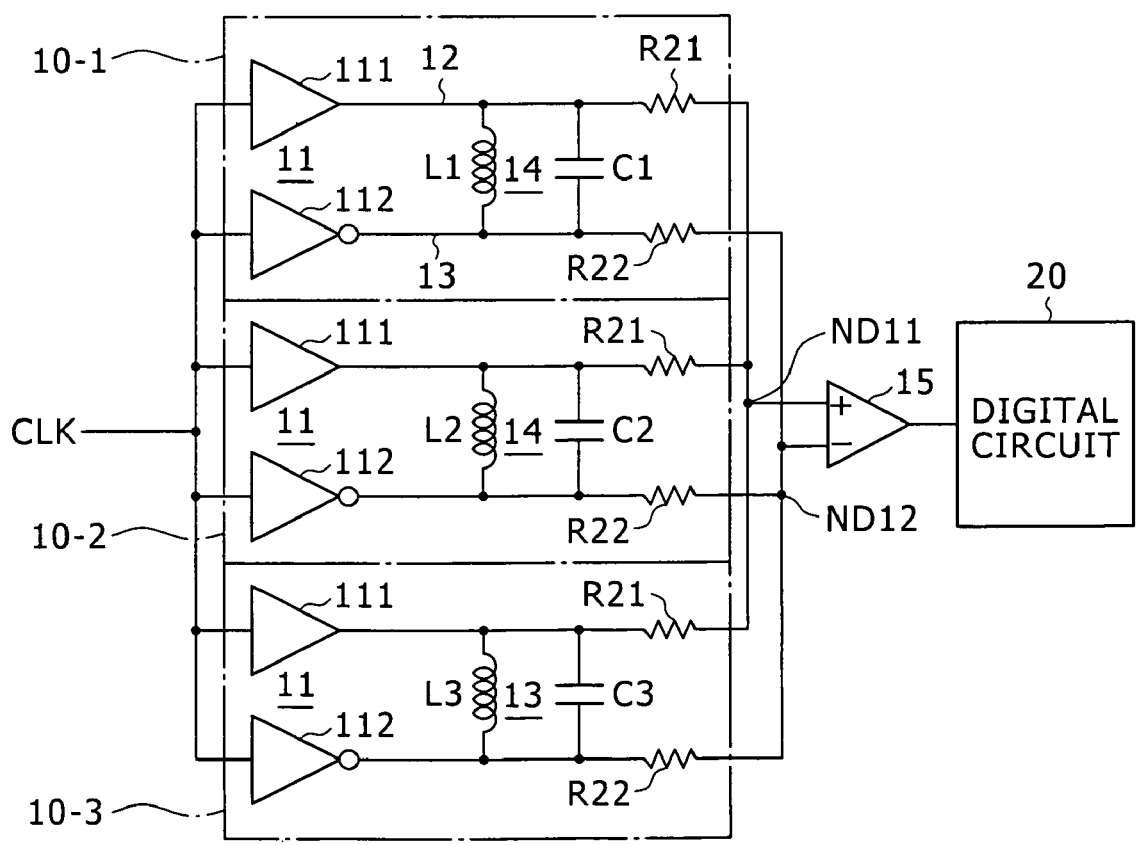
FIG. 9 is circuit diagram showing an example of a configuration of a further stabilized clock supplying apparatus to which the present sixth embodiment is applied.

FIG. 9 shows an example of a configuration of a yet further stabilized clock supplying apparatus to which the present invention is applied.

Referring to FIG. 9, the clock supplying apparatus 10C according to the sixth embodiment of the present invention is a modification to, and has a configuration similar to, the clock supplying apparatus 10A of the second embodiment. However, the clock supplying apparatus 10C is different from the clock supplying apparatus 10A in that not a single clock supplying apparatus but a plurality of clock supplying units 10-1 to 10-n (in the present embodiment, n=3) are connected in parallel to each other between an input line of the original clock CLK and an input of the differential input comparator 15. Each of the clock supplying units 10-1 to 10-n is configured such that first and second resistance elements R21 and R22, which serve as first and second passive elements, are connected to the clock lines 12 and 13 of the clock supplying apparatus of FIG. 2, respectively.

The first resistance elements R21, which are first passive elements of the clock supplying units 10-1 to 10-3, are connected at one end thereof to each other to form a first node ND11, and the second resistance elements R22, which are second passive elements of the clock supplying units 10-1 to 10-3, are connected at one end thereof to each other to form a second node ND12.

The first node ND11 is connected to a non-inverting input terminal (+) of the differential input comparator 15 while the second node ND12 is connected to an inverting input terminal (−) of the differential input comparator 15.

The reason why a plurality of clock supplying units are provided is described below.

Where the configuration of the clock supplying apparatus which includes a single LC resonance circuit as in the first and second embodiments is adopted, if the frequency of the original clock CLK varies and is displaced by a great amount from a resonance frequency, then the impedance of the LC resonance circuit decreases.

Therefore, the output voltage amplitude of the LC resonance circuit progressively decreases, resulting in the possibility that the logic circuit at the succeeding stage may not operate.

In order to eliminate the problem just described, it seems that a possible idea is to prepare a plurality of LC resonance circuits and use a selector to select one of the LS resonance circuits. In this instance, however, it is necessary to input a suitable selection signal from the outside or to use a complicated automatic control mechanism.

Therefore, in the clock supplying apparatus 10C of the present sixth embodiment, the fact that the voltage amplitude of an LC resonance circuit decreases if the clock frequency is displaced by a great amount from a resonance frequency is utilized conversely such that outputs of the LC resonance circuits 14 are synthesized using passive elements, such as resistance elements, and buffered to implement a configuration that can be applied to a greater frequency range.

With the clock supplying apparatus 10C of the sixth embodiment, since the voltage output of the one of the LC resonance circuits which has a resonance frequency comparatively close to the clock frequency becomes higher than the voltage outputs of the other LC resonance circuits, even if a select signal is not applied from the outside, a jitter reduction effect can be achieved over a wide frequency range.

Seventh Embodiment

Figure 10:
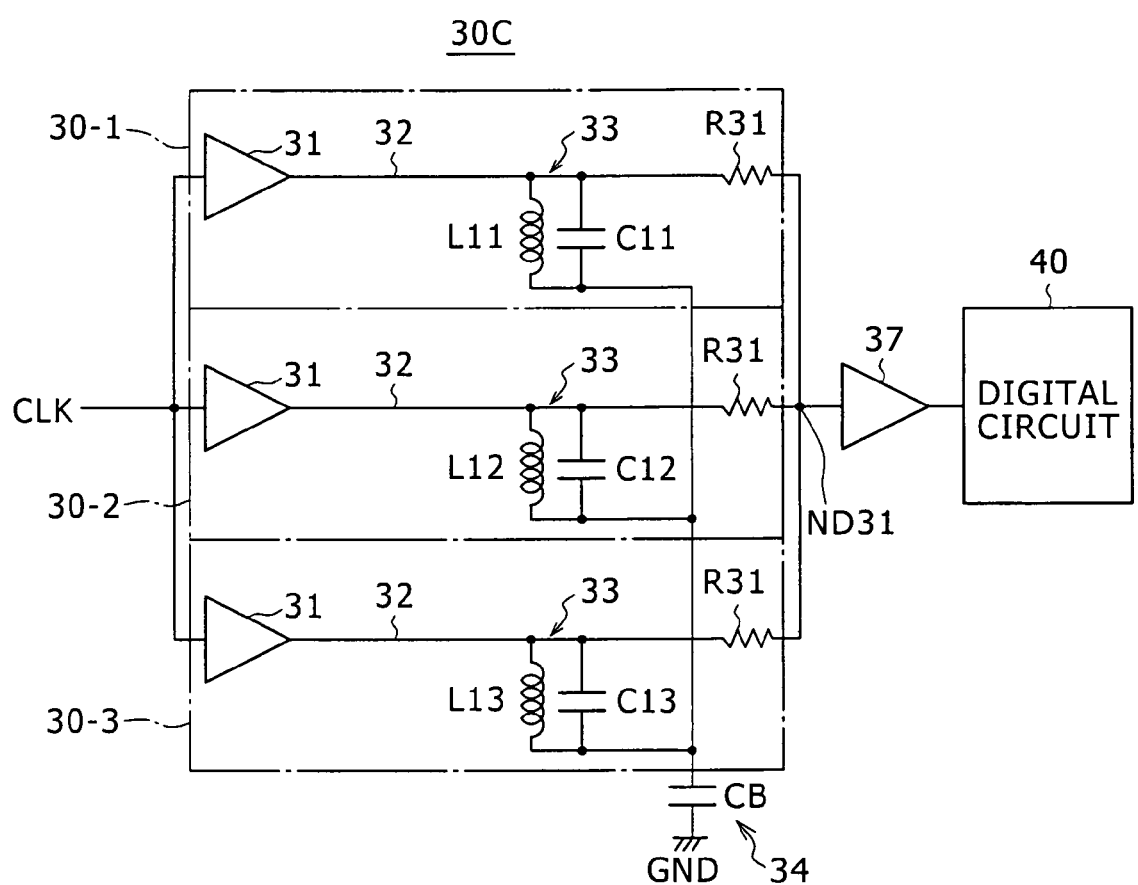
FIG. 10 is circuit diagram showing an example of a configuration of a further stabilized clock supplying apparatus to which the present seventh embodiment is applied.

FIG. 10 shows an example of a configuration of a yet further stabilized clock supplying apparatus to which the present seventh embodiment is applied.

Referring to FIG. 10, the clock supplying apparatus 30C according to the seventh embodiment of the present invention is a modification to, and has a configuration similar to, the clock supplying apparatus 30A of the third embodiment. However, the clock supplying apparatus 30C is different from the clock supplying apparatus 30A in that not a single clock supplying apparatus but a plurality of clock supplying units 30-1 to 30-n (in the present embodiment, n=3) are connected in parallel to each other to an input line for a original clock CLK. Each of the clock supplying units 30-1 to 30-n is configured such that a resistance element R31, which serves as a passive element, is connected to the clock line 32 of the clock supplying apparatus of FIG. 6.

Further, the resistance elements R31, which are passive elements of the clock supplying units 30-1 to 30-3, are connected at one end thereof to one another to form a node ND31, which is connected to the digital circuit 40 through a buffer 37.

It is to be noted that the bias circuit 34 is used commonly to the clock supplying units 30-1 to 30-3.

The reason why a plurality of clock supplying units are provided in this manner is the same as in the case of the clock supplying apparatus 30C of the sixth embodiment described hereinabove.

In particular, where the configuration of the clock supplying apparatus which includes a single LC resonance circuit as in the third to fifth embodiments is adopted, if the frequency of the original clock CLK varies and is displaced by a great amount from a resonance frequency, then the impedance of the LC resonance circuit decreases.

Therefore, the output voltage amplitude of the LC resonance circuit progressively decreases, resulting in the possibility that the logic circuit at the succeeding stage may not operate.

In order to eliminate the problem just described, it seems that a possible idea is to prepare a plurality of LC resonance circuits and use a selector to select one of the LS resonance circuits. In this instance, however, it is necessary to input a suitable selection signal from the outside or to use a complicated automatic control mechanism.

Therefore, in the clock supplying apparatus 30C of the present seventh embodiment, the fact that the voltage amplitude of an LC resonance circuit decreases if the clock frequency is displaced by a great amount from a resonance frequency is utilized conversely such that outputs of the LC resonance circuits 33 are synthesized using passive elements, such as resistance elements, and buffered to implement a configuration that can be applied to a greater frequency range.

With the clock supplying apparatus 30C of the seventh embodiment, since the voltage output of the one of the LC resonance circuits which has a resonance frequency comparatively close to the clock frequency becomes higher than the voltage outputs of the other LC resonance circuits, even if a select signal is not applied from the outside, a jitter reduction effect can be achieved over a wide frequency range.

Figure 11:
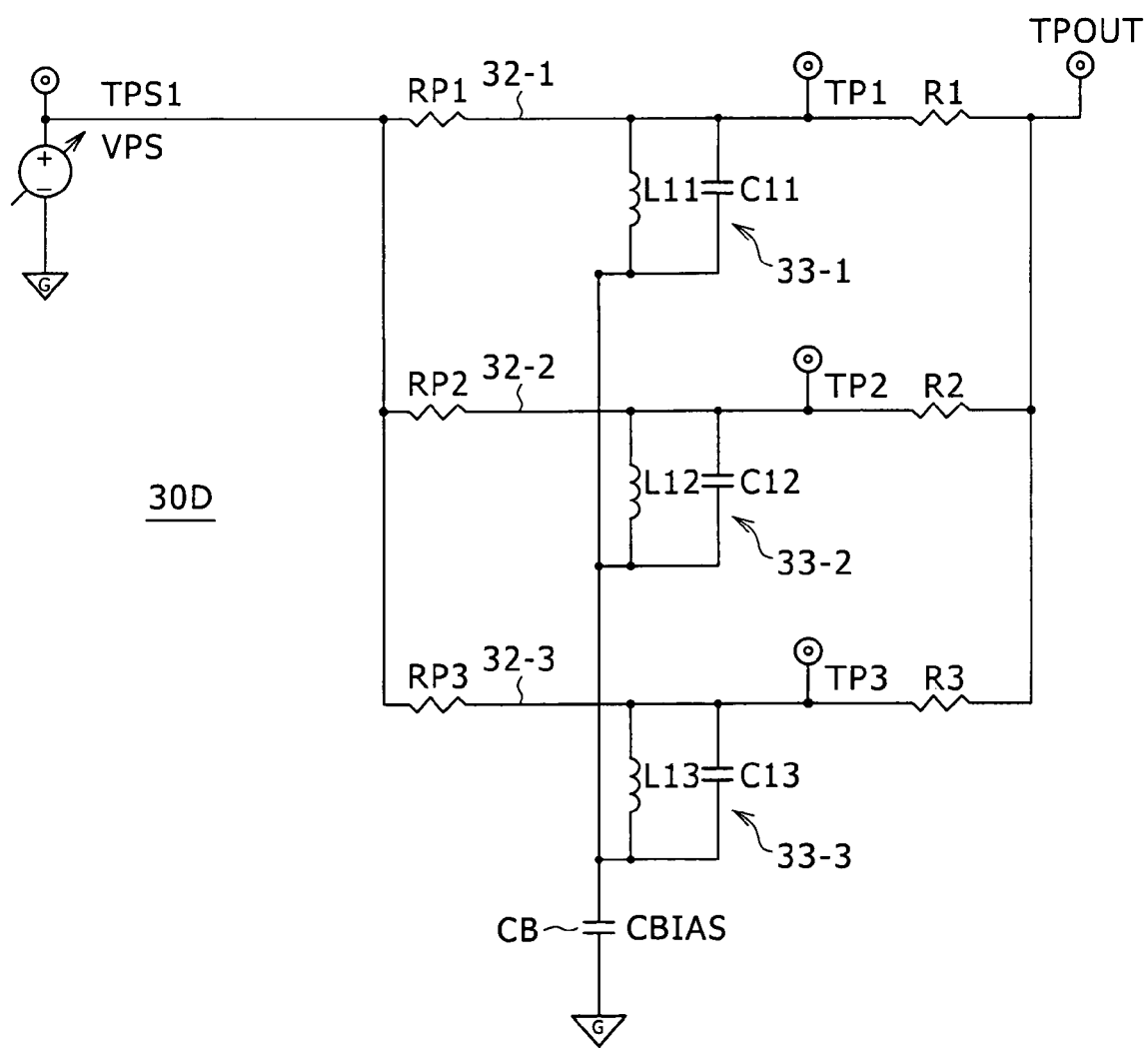
FIG. 11 is a circuit diagram showing a Spice simulation circuit for the clock supplying apparatus of FIG. 10.

Such a Spice simulation circuit 30D for the clock supplying apparatus of FIG. 10, as seen in FIG. 11, was used to perform a simulation.

In the Spice simulation circuit 30D of FIG. 11, reference character TPS1 denotes an input terminal of a clock; TP1 to TP3 denote output terminals of the LC parallel resonance circuit 33; and TPOUT denotes an output terminal of the clock driver 31.

Further, reference characters RP1 and R1 denote resistance elements interposed in a clock line 32-1; RP2 and R2 denote resistance elements interposed in another clock line 32-2; and RP3 and R3 denote resistance elements interposed in a further clock line 32-3.

Figure 12:
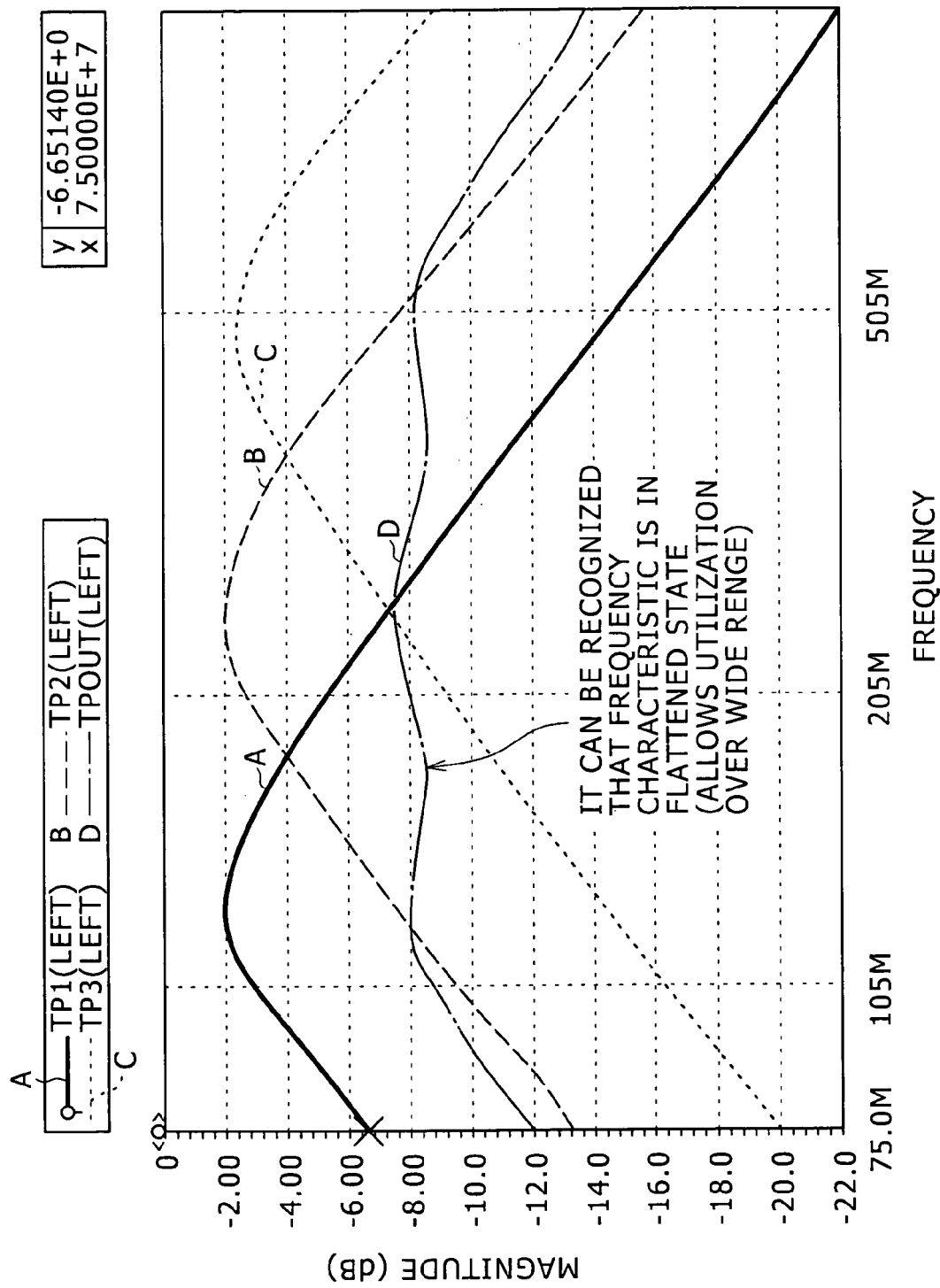
FIG. 12 is a waveform diagram illustrating a frequency characteristic of a result of the Spice simulation carried out using the circuit of FIG. 11.

FIG. 12 illustrates a frequency characteristic of a result of the Spice simulation carried out using the circuit of FIG. 11.

Figure 13:
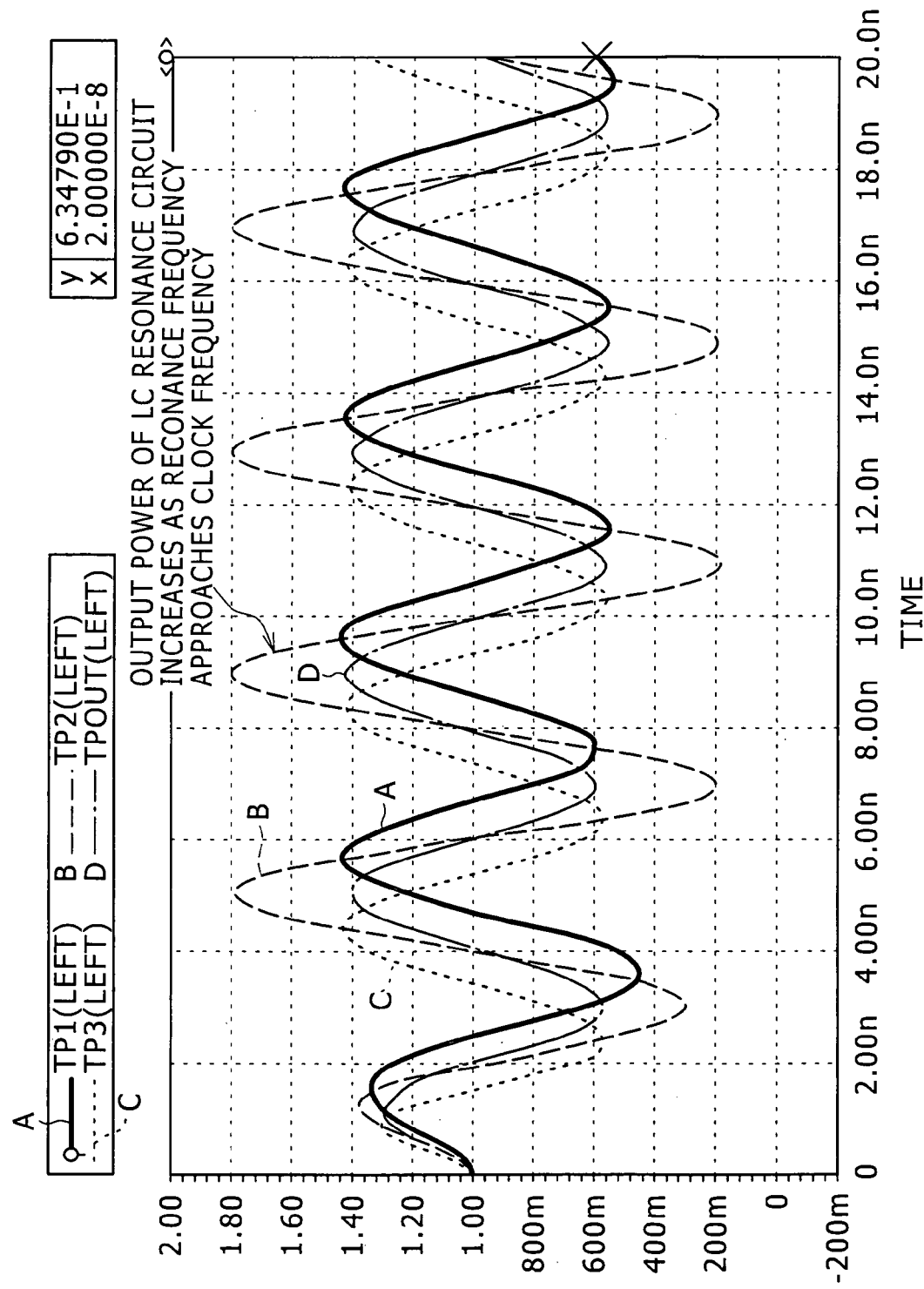
FIG. 13 is a waveform diagram illustrating a result of the Spice simulation carried out using the circuit of FIG. 11.

FIG. 13 illustrates a result of the Spice simulation carried out using the circuit of FIG. 11.

In FIG. 12, the axis of abscissa indicates the frequency, and the axis of ordinate indicates the magnitude (dB). Meanwhile, in FIG. 13, the axis of abscissa indicates the time, and the axis of ordinate indicates the relative level.

Further, the curve indicated by reference character A in FIG. 12 represents a frequency characteristic at the output terminal TP1 of a resonance circuit 33-1; the curve indicated by reference character B represents an output waveform at an output terminal TP2 of another resonance circuit 33-2; the curve indicated by reference character C represents a frequency characteristic at an output terminal TP3 of a further resonance circuit 33-3; and the curve indicated by reference character D represents a frequency characteristic at an output terminal TPOUT.

As can be seen from FIG. 12, the frequency characteristic of the output clock signal at the node ND31 is in a flattened form, and the output clock signal can be utilized over a wide range.

Further, the waveform indicated by reference character A in FIG. 13 represents an output waveform at the output terminal TP1 of the resonance circuit 33-1; the waveform indicated by reference character B represents an output waveform at the output terminal TP2 of the resonance circuit 33-2; the waveform indicated by reference character C represents an output waveform at the output terminal TP3 of the resonance circuit 33-3; and the curve indicated by reference character D represents an output waveform at the output terminal TPOUT.

As can be seen from FIG. 13, where the resonance frequency is proximate to the clock frequency, the LC resonance circuit exhibits a high output.

Then, even where the input signal is influenced by jitters and so forth, the output waveform B of the LC parallel resonance circuit is outputted from the output terminal TPOUT with the influence thereof compensated for.

In particular, as can be recognized also from FIGS. 12 and 13, with the clock supplying apparatus 30C of the seventh embodiment, since the voltage output of the one of the LC resonance circuits which has a resonance frequency comparatively close to the clock frequency becomes higher than the voltage outputs of the other LC resonance circuits, even if a select signal is not applied from the outside, a jitter reduction effect can be achieved over a wide frequency range.

While preferred embodiments of the present invention have been described using specific terms, such description is for illustrative purpose only, and it is to be understood that changes and variations may be made without departing from the spirit or scope of the following claims.

What is claimed is:

1. A clock supplying apparatus for supplying a clock to a digital circuit, comprising:

a plurality of clock supplying units;

each of said clock supplying units including:

a differential clock driver configured to receive an original clock inputted thereto and generate a first a clock of a positive phase and a second clock of a reverse phase from the original clock;

a first clock line along which a first clock of a positive phase from said clock driver propagates;

a second clock line along which a second clock of a reverse phase from said clock driver propagates;

a parallel resonance circuit of an inductor and a capacitor;

a first passive element connected to said first clock line; and a second passive element connected to said second clock line;

said inductor of said parallel resonance circuit being connected at a first end to said first clock line and at a second end to said second clock line;

said capacitor of said parallel resonance circuit being connected at a first terminal thereof to said first clock line and at a second terminal to said second clock line;

the first passive elements of said clock supplying units being connected to each other while the second passive elements of said clock supplying units are connected to each other.

2. The clock supplying apparatus according to claim 1, comprising a differential input comparator being connected to a differential input to which the connecting point of said first passive elements and the connecting point of said second passive elements are connected, said differential input comparator configured to output a comparison result to the digital circuit.

* * * * *